United States Patent
Yoo et al.

(10) Patent No.: US 8,741,675 B2
(45) Date of Patent: Jun. 3, 2014

(54) METHOD OF MANUFACTURING SEMICONDUCTOR LIGHT EMITTING DEVICE AND MASK FOR APPLICATION OF PASTE USED THEREFOR

(75) Inventors: Cheol Jun Yoo, Chungcheongnam-do (KR); Seong Jae Hong, Gyeonggi-do (KR)

(73) Assignee: Samsung Electronics Co., Ltd., Seoul (KR)

( * ) Notice: Subject to any disclaimer, the term of this patent is extended or adjusted under 35 U.S.C. 154(b) by 37 days.

(21) Appl. No.: 13/409,641

(22) Filed: Mar. 1, 2012

(65) Prior Publication Data

US 2012/0252145 A1 Oct. 4, 2012

(30) Foreign Application Priority Data

Mar. 29, 2011 (KR) ........................ 10-2011-0028308

(51) Int. Cl.
*H01L 21/78* (2006.01)
*H01L 33/50* (2010.01)
*H01L 33/54* (2010.01)

(52) U.S. Cl.
USPC .............................. 438/33; 313/502; 313/512

(58) Field of Classification Search
CPC ....... H01L 21/78; H01L 33/502; H01L 33/58; H01L 33/60; H01L 33/62
See application file for complete search history.

(56) References Cited

U.S. PATENT DOCUMENTS

| 7,049,159 | B2 | 5/2006 | Lowery | |
|---|---|---|---|---|
| 2005/0199580 | A1 | 9/2005 | Yang et al. | |
| 2007/0023702 | A1 | 2/2007 | Yotsuya | |
| 2007/0080626 | A1* | 4/2007 | Son et al. | 313/499 |
| 2007/0159067 | A1* | 7/2007 | Yun et al. | 313/503 |
| 2012/0142124 | A1* | 6/2012 | Yoo et al. | 438/16 |

FOREIGN PATENT DOCUMENTS

| JP | 4379394 B2 | 12/2009 |
|---|---|---|
| KR | 10-2007-0054323 A | 5/2007 |

* cited by examiner

*Primary Examiner* — Zandra Smith
*Assistant Examiner* — Pamela E Perkins
(74) *Attorney, Agent, or Firm* — McDermott Will & Emery LLP (57) ABSTRACT

Provided are a mask for an application of paste and a method of manufacturing a semiconductor light emitting device by using the same. The method includes preparing a light emitting structure including first and second conductive semiconductor layers and an active layer disposed therebetween, which has at least one electrode formed on a surface of the light emitting structure; disposing a mask having an open part exposing a portion of the surface of the light emitting structure therethrough and a recess part corresponding the electrode in a region thereof on a surface of the light emitting structure; and applying wavelength conversion material-containing paste to the surface of the light emitting structure through the open part.

20 Claims, 7 Drawing Sheets

METHOD OF MANUFACTURING SEMICONDUCTOR LIGHT EMITTING DEVICE AND MASK FOR APPLICATION OF PASTE USED THEREFOR

CROSS-REFERENCE TO RELATED APPLICATIONS

This application claims the priority of Korean Patent Application No. 10-2011-0028308 filed on Mar. 29, 2011, in the Korean Intellectual Property Office, the disclosure of which is incorporated herein by reference.

BACKGROUND OF THE INVENTION

1. Field of the Invention

The present invention relates to a method of manufacturing a semiconductor light emitting device and a mask for an application of paste used therefor.

2. Description of the Related Art

In general, a light emitting diode (LED) is a device used for transmitting a signal converting electrical energy into infrared rays, visible rays, or another form of light, by using compound semiconductor properties. The LED produces electroluminescence (EL), and an LED using a group III-V compound semiconductor is currently in practical use. The group III nitride-based compound semiconductor is a direct transition type semiconductor, which may perform a stabilized operation at a relatively high temperature as compared with devices employing other semiconductors. Therefore, the group III nitride-based compound semiconductor has been widely applied to a light emitting device such as an LED, a laser diode (LD), or the like.

Each chip configuring the light emitting device may be manufactured to allow for the growth of a semiconductor layer on a single wafer, separating the wafer into unit chips through a cutting process, and applying a phosphor layer including wavelength conversion phosphor particles to an upper surface of each of the separated chips. Here, a wire bonding pad may be polluted with a resin in a phosphor application process, causing a defective connection of a wire. Further, in a case in which a phosphor layer having a nonuniform thickness is applied to a chip surface, or is not entirely applied to the chip surface such that a portion thereof is not covered with the phosphor, that is, when precision in the phosphor application process is not secured, light emitting characteristics may be deteriorated.

SUMMARY OF INVENTION

An aspect of the present invention provides a method of manufacturing a semiconductor light emitting device, having enhanced precision and reliability in a wavelength conversion material-containing paste application process and increased efficiency in a phosphor application process.

Another aspect of the present invention provides a mask for an application of paste, through which a wavelength conversion material-containing paste may be uniformly applied to a light emitting device surface, and a method of manufacturing a semiconductor light emitting device. According to an aspect of the present invention, there is provided a method of manufacturing a semiconductor light emitting device, the method including: preparing a light emitting structure including first and second conductive semiconductor layers and an active layer disposed therebetween; forming at least one electrode on a surface of the light emitting structure; disposing a mask having an open part exposing a portion of the surface of the light emitting structure therethrough and a recess part corresponding the electrode in a region thereof on a surface of the light emitting structure; applying wavelength conversion material-containing paste to the surface of the light emitting structure through the open part.

The electrode may be disposed within the recess part of the mask.

The recess part may be formed to have a shape corresponding to that of the electrode.

The electrode may be formed in plural on a unit region of a device provided by separating the light emitting structure into unit regions.

The mask may include a plurality of open parts, and the unit region of the device on which the separated light emitting structure is formed may be exposed through the plurality of open parts.

The mask may include an extended open part that is extended from a corner provided by an adjacent side wall formed in the interior of the open part.

One surface of the mask may be coated with a high hardness material.

In this case, the high hardness material may contain at least one of Al or a transition metal nitride, a carbo-nitride, diamond-like carbon (DLC), amorphous carbon, and a cubic boron nitride.

The applying of the wavelength conversion material-containing paste may be performed through a screen printing or spray coating scheme.

The method of manufacturing a semiconductor light emitting device may further include sequentially stacking a first conductive semiconductor layer, an active layer and a second conductive semiconductor layer on a wafer, to thus form a light emitting structure.

The method may further include forming a conductive substrate on the second conductive semiconductor layer of the light emitting structure.

The method may further include separating the light emitting structure to which the wavelength conversion material-containing paste has been applied, into device units.

The wavelength conversion material-containing paste may contain at least one of a phosphor particle and a quantum dot.

The method may further include forming a bump on the electrode after applying wavelength conversion material-containing paste thereto.

According to another aspect of the present invention, there is provided a method of manufacturing a semiconductor light emitting device, the method including: preparing a light emitting structure including first and second conductive semiconductor layers and an active layer disposed therebetween; disposing a mask having an open part to which at least a portion of a surface of the light emitting structure is exposed, the open part having a sidewall therein, and an extended open part formed to extend from a corner provided by the sidewall adjacent thereto; and applying a wavelength conversion material-containing paste to the surface of the light emitting structure through the open part and the extended open part.

The open part may have a polyprismatic-shape.

The extended open part may have a cylindrical or polyprismatic shape.

The mask may include a plurality of open parts through which a unit area of a device to be provided through a separation process of the light emitting structure may be exposed.

One surface of the mask may be coated with a high hardness material.

In this case, the high hardness material may contain at least one of Al or a transition metal nitride, a carbo-nitride, diamond-like carbon (DLC), amorphous carbon, and a cubic boron nitride.

The applying of the wavelength conversion material-containing paste may be performed through a screen printing or spray coating scheme.

According to another aspect of the present invention, there is provided a mask for an application of paste, the mask including: a mask body having opposing first and second principal surfaces; an open part formed to penetrate the mask body in a thickness direction of the mask body; and a recess part formed in at least one surface of the first and second principal surfaces, and formed by removing a portion of a region of the mask body so as not to penetrate the mask body.

The open part may include a sidewall provided by the mask body therein, and may further include an extended open part formed to extend from a corner provided by the sidewall adjacent thereto and formed to penetrate the mask body.

The extended open part may have a cylindrical or polyprismatic shape.

At least one surface of the first and second principal surfaces may be coated with a high hardness material.

In this case, the high hardness material may contain at least one of Al or a transition metal nitride, a carbonitride, diamond like carbon (DLC), amorphous carbon, and a cubic boron nitride.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE INVENTION

Embodiments of the present invention will now be described in detail with reference to the accompanying drawings such that they could be easily practiced by those having skill in the art to which the present invention pertains. However, in describing the embodiments of the present invention, detailed descriptions of well-known functions or constructions will be omitted so as not to obscure the description of the present invention with unnecessary detail.

In addition, like reference numerals denote like elements throughout the drawings.

Unless explicitly described to the contrary, the word "comprise" and variations such as "comprises" or "comprising," will be understood to imply the inclusion of stated elements but not the exclusion of other elements.

FIGS. 1 to 4 are schematic cross-sectional views showing a method of manufacturing a semiconductor light emitting device according to an embodiment of the present invention. According to the embodiment of the present invention, a method of manufacturing a semiconductor light emitting device may include forming a light emitting structure 4 including first and second conductive semiconductor layers 41 and 43 with an active layer 42 formed therebetween; forming an electrode 4a on at least one surface of the light emitting structure 4 to be electrically connected to the first and second conductive semiconductor layers 41 and 43; disposing a mask 100 having an open part 10 to which a portion in the surface of the light emitting structure 4 having the electrode 4a formed thereon is exposed and a recess part 20 formed to have a shape corresponding to the electrode 4a; and applying a wavelength conversion material-containing paste 6 to the surface of the light emitting structure 4 through the open part 10.

Figure 1:
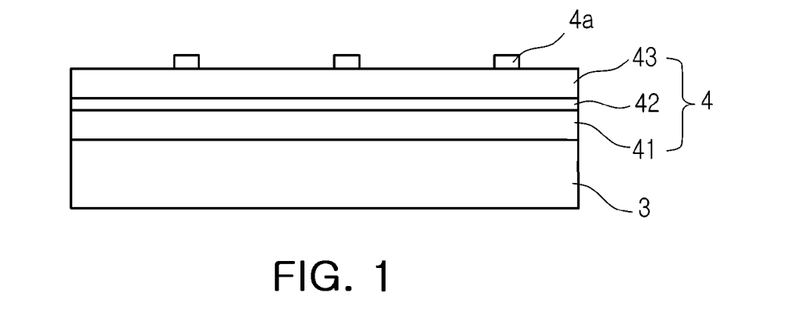
FIGS. 1 to 4 are schematic cross-sectional views showing a method of manufacturing a semiconductor light emitting device according to an embodiment of the present invention.

First, referring to FIG. 1, the light emitting structure 4 may be formed to include the first conductive semiconductor layer 41, the active layer 42 and the second conductive semiconductor layer 43. Subsequently, on each unit region of a device to be formed by separating the light emitting structure 4, the electrode 4a may be formed. The light emitting structure 4 may be formed through a sequential growth process during a semiconductor layer growth process such as a molecular beam epitaxy (MBE) process, a hybride vapor phase epitaxy (HYPE) process, or the like. Unlike this, a conductive substrate (not shown) may be formed on an upper surface of the light emitting structure 4 grown on the semiconductor growth wafer 3, and then, the growth substrate may be removed to expose the first conductive semiconductor layer 41 and form an electrode (not shown) on an upper surface of the exposed first conductive semiconductor layer 41 such that the electrode may be electrically connected to the first conductive semiconductor layer 41.

The wafer 3 may be a semiconductor growth substrate, and in detail, the growth substrate may be formed of a material such as sapphire, SiC, MgAl2O4, MgO, LiAlO2, LiGaO2, GaN or the like. In this case, sapphire is crystal having a hexa-rhombo R3c symmetry, for which lattice constants in c-axis and a-axis directions are respectively 13.001 Å and 4.758 Å, and which have a surface C (0001), a surface A (1120), a surface R (1102), and the like. Here, the surface C may allow for a relatively easy growth of a nitride thin film and may be stabilized at a relatively high temperature, such that the surface C may be principally used as a substrate for a nitride growth. Though not shown, a buffer layer constructed of an undoped semiconductor layer formed of a nitride or the like may be interposed in order to relieve a lattice defect occurrence in the light emitting structure grown on the substrate, and thereon, a sequential growth may be performed using a semiconductor layer growth process such as a metalorganic chemical vapor deposition (MOCVD), MBE, HVPE, or the like, to thus form the light emitting structure 4.

The first and second conductive semiconductor layers 41 and 43 may respectively become n-type and p-type semiconductor layers, and may be formed of a nitride semiconductor. Therefore, although it is not particularly limited, it may be understood that the first and second conductive types are each n-type and p-type according to the present embodiment. The first and second conductive semiconductor layers 41 and 43 may be expressed by a compositional formula $Al_xIn_yGa_{(1-x-y)}N$ (here, $0 \leq x \leq 1$, $0 \leq y \leq 1$, $0 \leq x+y \leq 1$), for example, a material such as GaN, AlGaN, InGaN, or the like, may belong thereto. The active layer 42 formed between the first and second conductive semiconductor layers 41 and 43 may emit light having a constant energy level provided by a recombination of electrons and holes, and may be formed to have a multiple quantum well (MQW) structure in which a quantum well layer and a quantum barrier layer are alternated with each other. In the case of an MQW structure, for example, an InGaN/GaN structure may be used.

The electrode 4a formed on each unit region of a device which will be formed by separating the light emitting structure 4, may be formed of a material containing any one of Au, Ni, Al, Cu, W, Si, Se and GaAs and may be formed using plating, sputtering, deposition processes, and the like. The electrode 4a may be formed on the second conductive semiconductor layer 43 to receive an electrical signal applied from the outside. Meanwhile, although one electrode 4a is shown as formed on each separated device unit region of the light emitting structure 4 according to the present embodiment, a plurality of electrodes may be also be formed on the separated device unit region to be electrically connected to the respective first and second conductive semiconductor layers.

On the other hand, a conductive substrate (not shown) may be formed on an upper surface of the light emitting structure 4, in detail, on an upper surface of the second conductive semiconductor layer 43, and then, the semiconductor growth substrate 3 may be removed. Subsequently, an electrode may be formed on the exposed first conductive semiconductor layer 41, and next, the present process may be progressed. In this case, the conductive substrate may serve as a support supporting the light emitting structure 4 in a laser lift-off process for removing the semiconductor growth substrate 3, or the like, and may be formed of a material containing one of Au, Ni, Al, Cu, W, Si, Se and GaAs. For example, an Si substrate may be doped with Al. In the case of the present embodiment, the conductive substrate may be adhered to the light emitting structure 4 through the medium of a conductive adhesive layer, and a eutectic metal material such as AuSn may be used therefor. After the conductive substrate is formed on the light emitting structure 4, the semiconductor growth substrate 3 may be removed through a process such as a laser lift-off process, a chemical lift-off process, or the like, by using the conductive substrate as a support.

Figure 2:
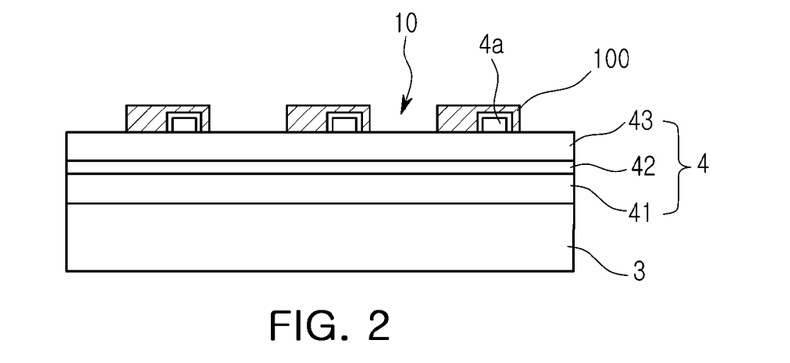

Next, referring to FIG. 2, on the light emitting structure 4 having the electrode 4a formed thereon, a mask 100 may be disposed. The mask 100 may include an open part 10 to which a surface portion of the light emitting structure 4 having the electrode 4a formed thereon is exposed, and a recess part 20 formed to have a shape corresponding to a shape of the electrode 4a and formed on a region thereof corresponding to the electrode 4a such that the electrode 4a may be received therein. The mask 100 may have opposing first and second principal surfaces. That is, the mask 100 may include the open part 10 that is formed to penetrate a mask body in a thickness direction of the mask body, and a recess part 20 formed in at least one surface of the first and second principal surfaces and formed by removing a portion of a region of the mask body so as not to penetrate the mask body.

Figure 5A:
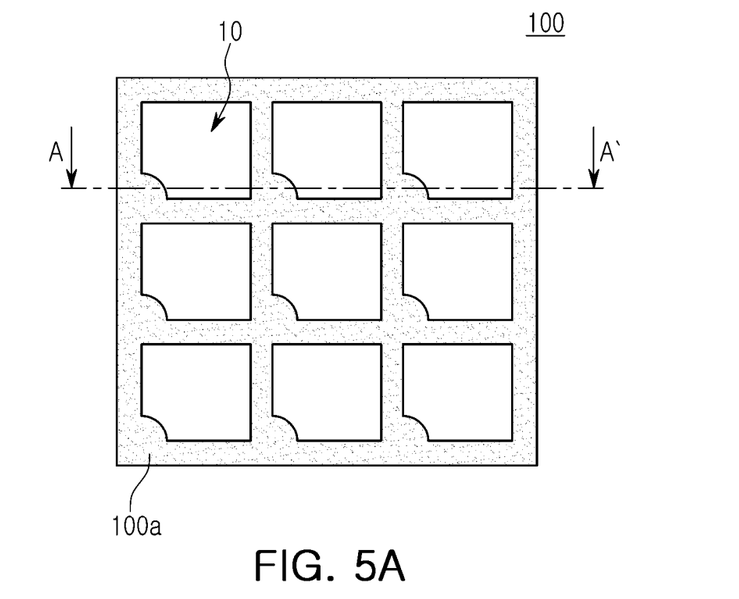
FIG. 5 illustrates schematic top and bottom views of a mask for an application of paste according to the embodiment of the present invention.
Figure 5B:
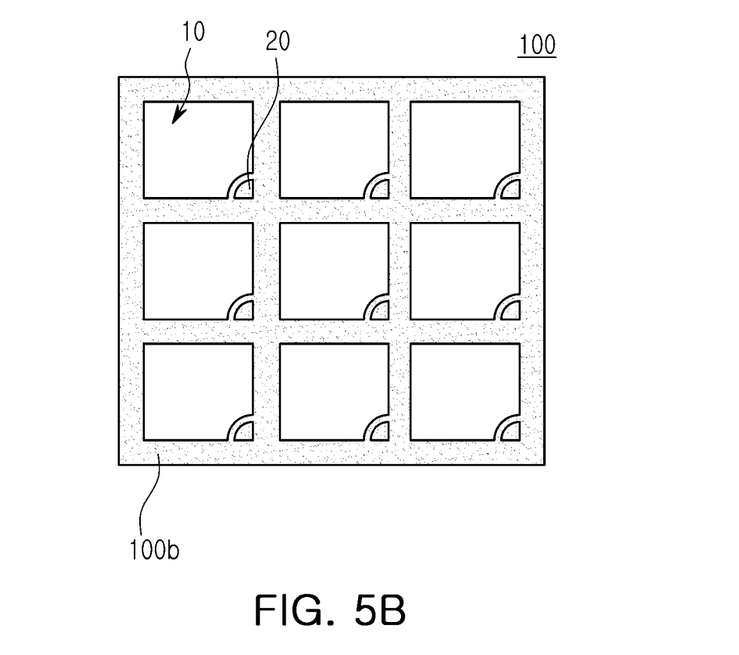
Figure 6:
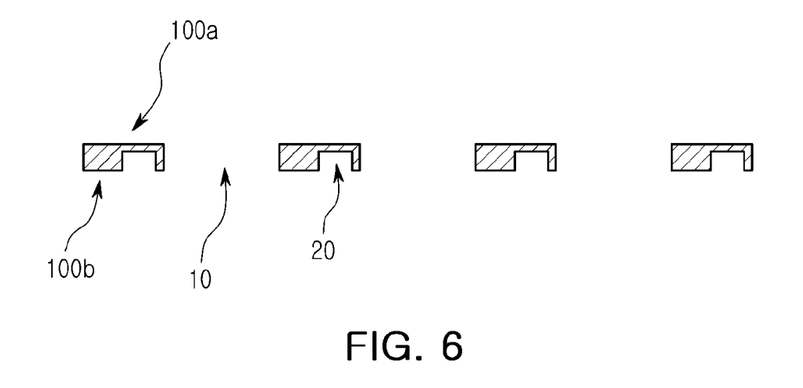
FIG. 6 is a schematic cross-sectional view taken along A-A' line in the mask for an application of paste shown in FIG. 5.

A mask applicable to the present embodiment will be described in detail with reference to FIGS. 5 to 8. FIG. 5 illustrates schematic top and bottom views of a mask for an application of paste according to the embodiment of the present invention. FIG. 6 is a schematic cross-sectional view taken along line A-A' in the mask for an application of paste shown in FIG. 5. In detail, FIG. 5A is a top plan view of the mask 100 for an application of paste according to the embodiment of the present invention, and FIG. 5B is a bottom plan view of the mask 100 for an application of paste according to the embodiment of the present invention, and here, top and bottom may indicate a relative concept and a surface having a paste applied thereto is optionally indicated as a top (or upper) surface herein. According to the embodiment of the present invention, the mask 100 for an application of paste may include a mask body having opposing first and second principal surfaces 100a and 100b; an open part 10 formed to penetrate the mask body in a thickness direction of the mask body; and a recess part 20 formed in at least one surface of the first and second principal surfaces 100a and 100b and formed by removing a portion of a region of the mask body so as not to penetrate the mask body.

First, referring to FIGS. 5 and 6, the mask 100 for an application of paste according to the present embodiment may include the recess part 20 that is formed to have a shape corresponding to the shape of the electrode 4a on a region thereof corresponding to a position of the electrode (4a) of the light emitting structure 4, so as to receive the electrode 4a therein, thereby enhancing reliability in a process of applying the wavelength conversion material-containing paste at the time of manufacturing a semiconductor light emitting device as a wafer unit. As shown in FIG. 5, the mask 100 may have the opposing first and second principal surfaces 100a and 100b, and in the first principal surface 100a, to which the paste will be applied, regions excepting a region having the open part 10 formed therein may be coplanar, and the recess part 20 may be formed in the second principal surface 100b that is formed in a direction toward the light emitting structure.

In general, the semiconductor light emitting device may be manufactured by sequentially stacking a first conductive semiconductor layer, an active layer and a second conductive semiconductor layer on a wafer to form a light emitting structure and then separating the light emitting structure into device units. Here, a wavelength conversion material-containing paste converting a wavelength of light emitted from the active layer of the light emitting structure may be applied to a light emission surface of the semiconductor light emitting device, to thus manufacture the semiconductor light emitting device capable of emitting white containing various colors of light. The paste may contain phosphor particles or quantum dots converting a light wavelength into any one of yellow, red and green light wavelengths, and a phosphor type may be determined by a wavelength of light emitted from the active layer of the light emitting structure. In detail, the wavelength conversion material-containing paste may contain one fluorescent material among YAG-based, TAG-based, Silicate-based, Sulfide-based and Nitride-based fluorescent materials, for example, when a phosphor converting a light wavelength into a yellow light wavelength is applied to a blue light emitting LED chip, a semiconductor light emitting device emitting a white light may be obtained.

Therefore, in order to manufacture a semiconductor light emitting device emitting various colors of light, a process of stacking a semiconductor layer on a wafer to form a light emitting structure and applying a paste to an upper surface thereof may be applied. To apply the paste thereto, in the case of disposing a mask for an application of paste on the light emitting structure having the electrode formed thereon, since an area of the mask covering the electrode may be larger than that of the electrode, the paste may infiltrate a an empty space provided between an electrode (bonding pad) with a preset height and the mask. In this case, the paste may be applied up to an electrode side surface, deteriorating electrode electrical characteristics. Further, paste may infiltrate a lower part of the mask due to pressure generated by pressing the paste by a squeeze or the like, causing a lower surface of the mask to be polluted with paste and accordingly, requiring an additional process in which the paste staining the lower part of the mask should be removed after every application of paste.

However, according to the present embodiment, on a lower surface of the mask for an application of paste, that is, on the second principal surface 100b of the mask provided to be directed toward to the light emitting structure, the recess part 20 having a shape corresponding to the shape of the electrode 4a may be formed in a region that corresponds to an electrode formation region of the light emitting device so as to receive the electrode 4a therein, thereby preventing paste from infiltrating the electrode formation region during the paste application process. In detail, in comparison with the case of a flat-shaped mask in which the recess part is not formed, a contact pressure may be increased on a separation surface between the recess part 20 and the open part 10 according to the embodiment of the present invention, thereby efficiently preventing paste from infiltrating an electrode formation region. In addition, in a case in which the paste is applied after forming the electrode, the electrode may be disposed in an inner portion of the recess part 20 such that a space between the electrode and the mask is not generated due to a direct contact of the mask with the electrode, thus preventing paste from flowing to an electrode side surface at a lower surface of the mask.

In the case of the paste applying process to which the mask for an application of paste 100 according to the present embodiment is applied, reliability in the paste applying process may be enhanced, and a process of removing paste staining a lower surface of a repetitively used mask, that is, staining the second principal surface 100b of the mask 100, may be omitted, thereby improving process efficiency.

Figure 7:
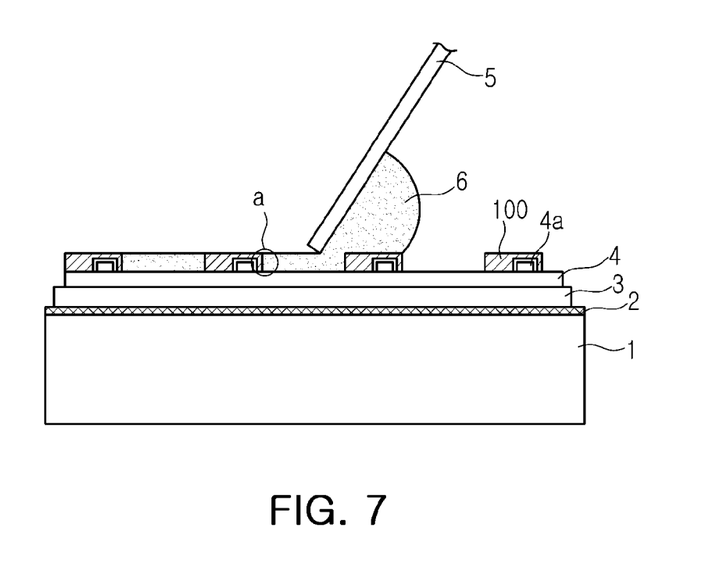
FIG. 7 schematically illustrates a paste application process performed using the mask for an application of paste provided according to the embodiment of FIG. 5.

FIG. 7 schematically illustrates a paste application process performed using the mask for an application of paste provided according to the embodiment of FIG. 5. In detail, an example applied to the paste application process using a screen printing scheme is shown in FIG. 7. With reference to FIG. 7, the first conductive semiconductor layer, the active layer and the second conductive semiconductor layer may be included therein, and the wafer 3 including the light emitting structure 4 including the electrode 4a formed thereon may be disposed on a support substrate 1, and thereon, the mask 100 for an application of paste according to the embodiment of the present invention may be disposed. In addition, in order to fix the wafer 3 having the light emitting structure 4 formed thereon to the support table 1, a carrier film 2 may be interposed between the wafer 3 and the support table 1.

In detail, in the paste application process using the screen printing scheme shown in FIG. 7, the mask 100 for an application of paste according to the present embodiment may be disposed on the light emitting structure 4, and the wavelength conversion material-containing paste 6 for forming a wavelength conversion layer may be squeezed onto the mask 100 by using a squeezer 5. The mask 100 may be formed of a metal such as steel use stainless (SUS), Ni, or the like, but is not limited thereto. The paste 6 may be applied only on a formation region of the open part 10 of the mask 100 according to a compressing process. Further, after the compressing process, a process for hardening the wavelength conversion material-containing paste 6 may be performed according to need. As described above, on the second principal surface 100b of the mask 100, a concavely shaped recess part 20 may be formed at a position corresponding to an electrode (4a) formation region of the light emitting structure 4. Therefore, in the case of the compressing process using the squeezer 4, pressure in a region (a) between the open part 10 and the recess part 20 increases such that the paste 5 may be prevented from infiltrating the interior of the electrode (4a) formation region.

As described above according to the present embodiment, in a case in which the paste application process is performed after a process of forming the electrode 4a, a depth of the recess part 20 formed in the second principal surface 100b of the mask 100 may be equal to or larger than a height of the electrode 4a. That is, the recess part 20 may be formed to have a depth larger than a height of the electrode 4a so as not to contact the electrode 4a. In this case, since damage of the electrode 4a due to the mask 100 may be prevented, an additional effect of enhancing device reliability may be obtained.

FIG. 7 shows an example in which the mask 100 for an application of paste according to the embodiment of FIG. 5 is applied to the screen printing scheme, but is not limited thereto. For example, the mask 100 may also be applied to the spray coating scheme in which viscosity of paste is relatively low. Meanwhile, in the wavelength conversion material-containing paste, phosphor particles may have a dispersed form in a medium of a high molecular transparent resin such as an epoxy resin, silicone, polyethylene, acrylate or the like, such that a viscosity thereof may be different according to a mixing ratio or a composed material. It will also be able to apply the mask to other phosphor application processes capable of being expected for its similar effect, including the screen printing scheme, the spray coating scheme.

Figure 8A:
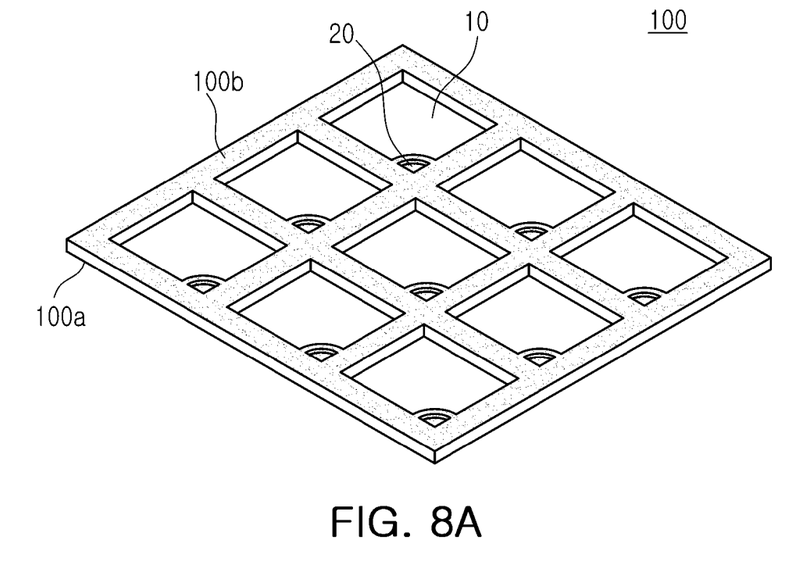
FIGS. 8A and 8B are schematic perspective views showing a structure of a mask for an application of paste according to an embodiment of the present invention.
Figure 8B:
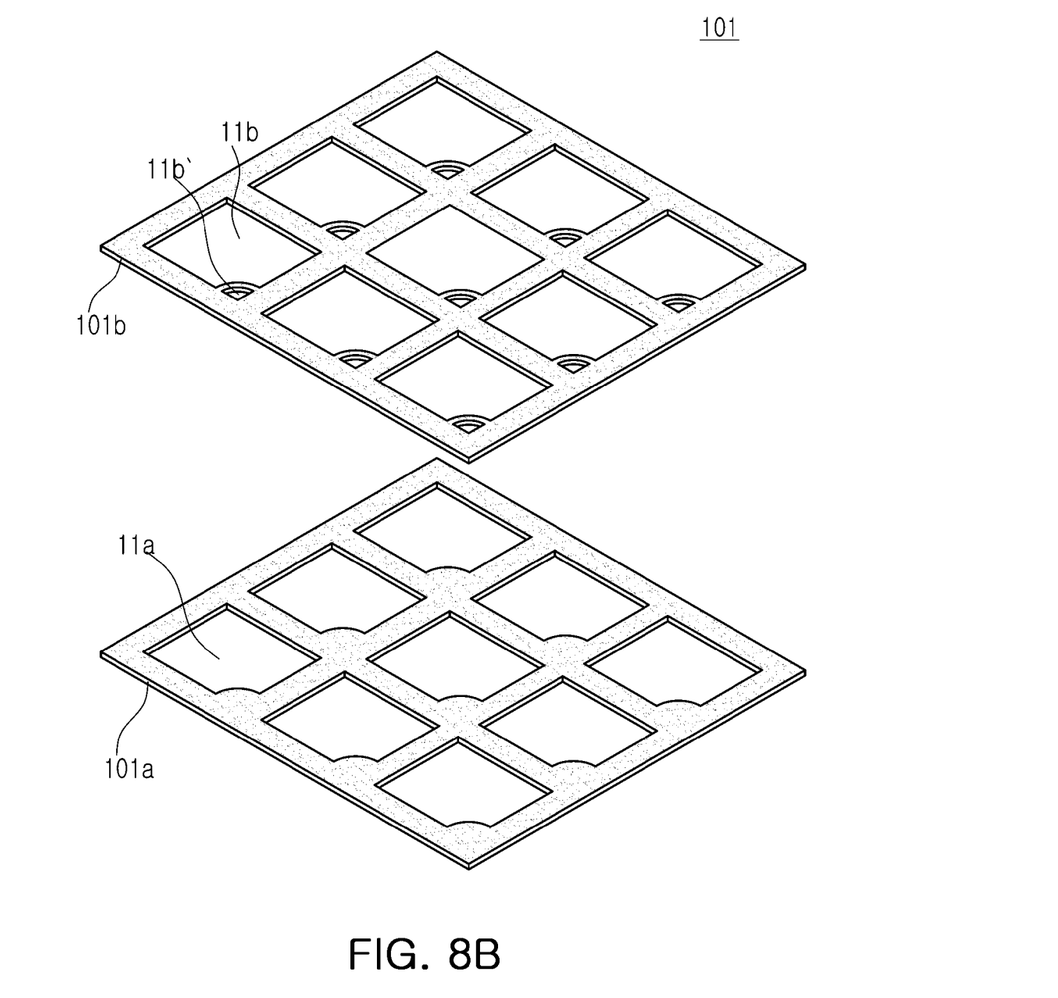

FIGS. 8A and 8B are schematic perspective views showing a structure of a mask for an application of paste according to an embodiment of the present invention. First referring to FIG. 8A, the mask 100 for an application of paste according to the embodiment of the present invention may include a mask body having opposing first and second principal surfaces 100a and 100b; an open part 10 formed to penetrate the mask body in a thickness direction of the mask body; and a recess part 20 formed in at least one surface of the first and second principal surfaces 100a and 100b, and formed by removing a portion of a region of the mask body so as not to penetrate the mask body.

With reference to FIG. 8A, the recess part 20 may be formed by etching the second principal surface 100b of the mask 100 by a predetermined depth. However, unlike this, as shown in FIG. 8B, a first mask 101a having an open portion 11a formed in a paste applied region of each light emitting device, and a second mask 101b having an open portion 11b formed on the paste applied region of each light emitting device and an open portion 11b' formed on an electrode formation region, may be separately formed, and then coupled to each other, to thus form the recess part 20. In this case, a depth of the recess part 20 may be easily controlled through a thickness of the second mask 10b.

FIG. 9 is a schematic top view of a mask for an application of paste according to another embodiment of the present invention. A mask 200 or 201 for an application of paste according to the embodiment of the present invention may include a mask body having first and second principal surfaces; an open part 210 or 211 formed to penetrate the mask body in a thickness direction of the mask body and to have a sidewall provided by the mask body; an extended open part 220 or 221 that is extended from a corner provided by an adjacent sidewall of the open part 210 or 211 and formed to penetrate the mask body. That is, by way of the extended open part 220 or 221 extended from an apex of the open part 210 or 211 according to the embodiment of the present invention, paste may be evenly distributed on a surface of the light emitting device, particularly, in the vicinity of the corner formed by the sidewall in an inner portion of the open part 220 or 221 of the mask for an application of paste, as a solution to defects according to the related art.

Figure 9A:
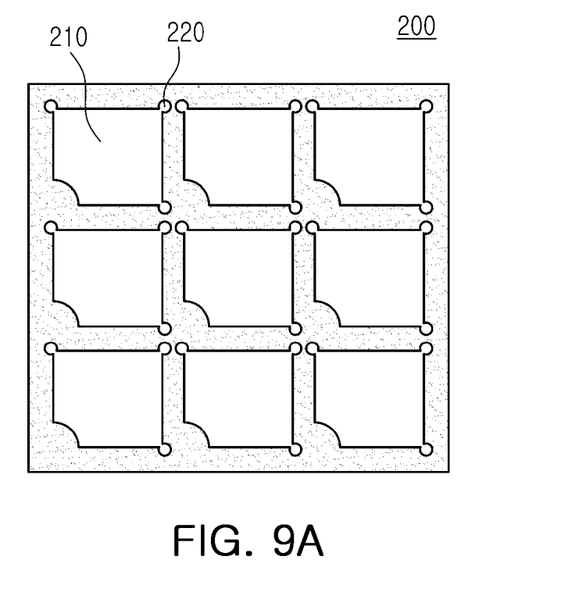
FIG. 9 is a schematic top view of a mask for an application of paste according to another embodiment of the present invention.

In detail, with reference to FIG. 9A, the open part 210 of the mask 200 for an application of paste according to the present embodiment may have a post shape with corners formed by the sidewall in the inner part thereof. The open part 210 may expose at least a portion of the surface of the light emitting device therethrough. In addition, the mask 200 according to the present embodiment may include the extended open part 220 extended from a corner provided by the inner sidewall of the open part 210, and the extended open part 220 may have a cylindrical shape formed to extend from three corners formed within the open part 210 having the post shape.

For example, in a case in which the semiconductor light emitting device has a square shape with regard to an upper surface of a chip and the wavelength conversion material-containing paste is applied to an upper surface thereof by using a mask including an open part having a square section shape, there may be defects in which paste is not evenly applied in the vicinity of apexes of the square-shaped open part. Since paste has a constant viscosity and a surface tension thereof lead to unevenly condensed paste; a region in which the paste is not evenly covered up to the periphery of apexes in the open part section of the mask, may easily be generated. The light emitting device manufactured as described above may emit non-converted wavelength light as it is, on a portion of a region of a chip surface, in detail, a region adjacent to the apexes of the open part section of the mask, thereby deteriorating light emitting device light characteristics.

However, according to the present embodiment, the extended open part 220 penetrating the mask, which is formed to extend from a corner provided by an adjacent sidewall within the open part 210 formed in the mask 200 for an application of paste, may be provided, thereby allowing for an increase of an amount of paste applied to the vicinity of a corner in the open part 210 of the mask 200, such that a wavelength conversion layer may be evenly formed to be distributed to the vicinity of apexes of the chip upper surface. Here, the mask 200 may include a plurality of open parts 210 formed in a device unit region, and since the extended open part 220 should be positioned within one device to be separated from the device unit region of the light emitting structure, the extended open part 220 may be formed so as not to contact an adjacent open part or an extended open part formed in an adjacent open part.

Figure 9B:
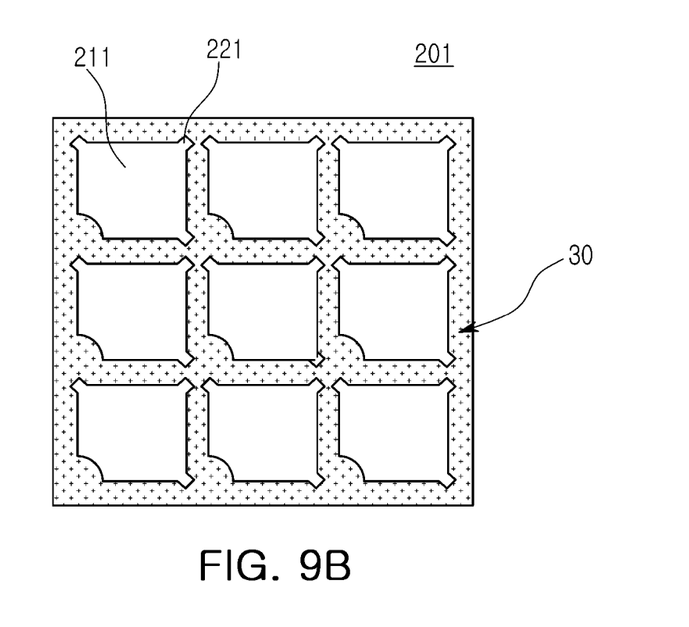

The extended open part 220 according to the present embodiment is shown as cylindrically shaped, but is not limited thereto, and may have various shapes such as a cylinder shape, an elliptic cylinder shape, a polyprismatic shape, or the like. FIG. 9B shows a variation example of the mask for an application of paste according to the present embodiment. The mask 201 for an application of paste according to the present embodiment with reference to FIG. 9B may include a plurality of open parts 211 formed in a device unit region, and extended open parts formed to respectively extend from corners provided by adjacent sidewalls in the open part 211. Unlike the embodiment of FIG. 9A, the extended open part 221 with reference to FIG. 9B may have a polyprismatic shape.

In addition, at least one surface of the mask 201 may be coated with a high hardness material 30. In detail, the high hardness material 30 may be coated on a surface on which paste is applied so as to prevent a scratch on a mask surface due to phosphor particles reciprocally moving by being pushed by the squeezer or the like during the paste applying process. Therefore, metal particles being detached from the mask may be prevented, and as a result, enhanced reliability in the phosphor application process may be provided. The high hardness material may contain at least one of Al or a transition metal nitride, a carbo-nitride, diamond-like carbon (DLC), amorphous carbon, and a cubic boron nitride.

FIG. 9B shows that the high hardness material 30 is coated on one surface of the mask 201 provided according to the embodiment of FIG. 9, but is not limited thereto. For example, on an upper surface of the mask 100 for an application of paste according to the embodiment of FIG. 5, that is, the first principal surface 100a to be covered with the wavelength conversion material-containing paste in the mask 100 having the recess part 20 formed in the electrode formation region thereof, the high hardness material 30 may also be coated, thereby providing the same effect as described above. The shape of the mask according to the embodiment of FIG. 9, that is, the shape of the mask including the open part 210 or 211 and the extended open part 221, may be also applied to the mask 100 provided according to the embodiment of the present invention shown in FIG. 5.

Figure 3:
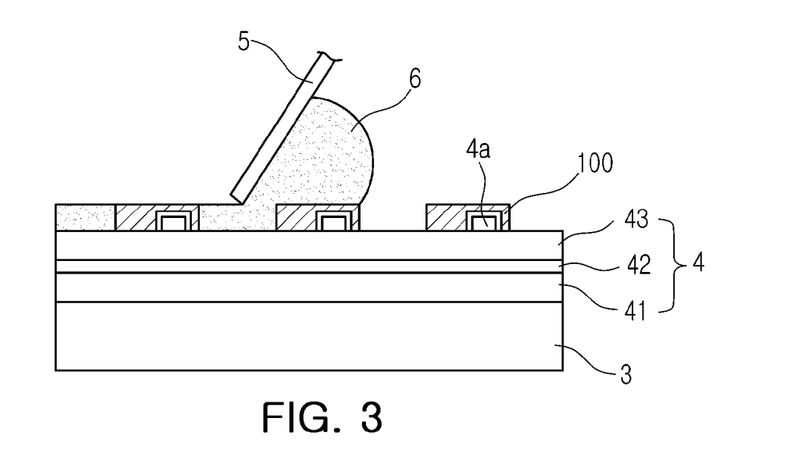

As shown in FIG. 3, the wavelength conversion material-containing paste 6 may be applied to an upper part of the mask 100 disposed on the light emitting structure 4, through the screen printing scheme, by using the above-described mask 100 or 200 for an application of paste. According to the present embodiment, the electrode 4a formed on an upper surface of the light emitting structure 4 may be disposed in an inner region of the recess part 20 of the mask 100, and since a contact pressure in a region between the open part 10 and the recess part 20 may be increased by the compressing process using the squeezer 5 at the time of applying the paste 6, the paste 6 may be prevented from covering the inside of the electrode (4a) formation region during the wavelength conversion material-containing paste applying process. The present embodiment describes a case in which the paste 6 is applied after the formation of the electrode 4a, but is not limited thereto. For example, after disposing the mask 100 such that the recess part 20 of the mask 100 is positioned at a region on which the electrode 4a will be formed, the electrode 4a may be formed on a region exposed by removing the mask 100.

Meanwhile, the paste applying process is illustrated to be performed through the screen printing scheme according to the present embodiment, but is not limited thereto. For example, a spray coating scheme may be applied to the present embodiment in a case in which there may be a defect which commonly occurs when paste infiltrates an electrode formation region, or the like.

Although it is not specifically described, on an upper surface of the mask 100 to which a paste is applied and the squeezer 5 is applied, a high hardness material containing at least one of Al or a transition metal nitride, a carbo-nitride, diamond-like carbon (DLC), amorphous carbon, and a cubic boron nitride may be coated. Whereby, metal particles may be prevented from being detached from the mask that is formed of a material such as a metal or the like.

The wavelength conversion material-containing paste 6 may contain wavelength conversion phosphor particles converting a wavelength of light emitted from the active layer 42 of the light emitting structure 4. The phosphor may be a phosphor converting a light wavelength into any one of yellow, red and green light wavelengths. Phosphor type may be determined by a wavelength of light emitted from the active layer 122 of the light emitting structure 4. In detail, the wavelength conversion material-containing paste may include anyone of YAG-based, TAG-based, Silicate-based, Sulfide-based, or Nitride-based fluorescent materials. For example, when a phosphor converting a light wavelength of emitted light into a yellow light wavelength is applied to a blue light emitting LED chip, a semiconductor light emitting device emitting white light may be obtained.

In addition, the paste 6 may contain quantum dots. A quantum dot is a nano crystal of a semiconductor material having a diameter of approximately 1 to 10 nm, and is a material providing a quantum confinement effect. The quantum dot may generate wavelength conversion light, that is, fluorescence, by converting a wavelength of light emitted from the light emitting structure 4. As quantum dots, there may be an Si-based nano crystal, a group II-VI-based compound semiconductor nano crystal, a group III-V-based compound semiconductor nano crystal, a group IV-VI-based compound semiconductor nano crystal, or the like, as an example. In the present embodiment, these may respectively be used alone or as a mixture thereof.

The quantum dots may be dispersed in a form of being naturally coordinated with a dispersive medium such as an organic solvent or a high molecular resin. As a dispersive medium of the paste 6, any transparent medium, which satisfies the conditions of not affecting wavelength conversion performance of a quantum dot, not being changed by light therein, or not reflecting light, and simultaneously not causing light absorption, is usable. For example, the organic solvent may contain at least one of toluene, chloroform, and ethanol, and the high molecular resin may contain at least one of an epoxy resin, silicone, polyethylene and acrylate.

Figure 4:
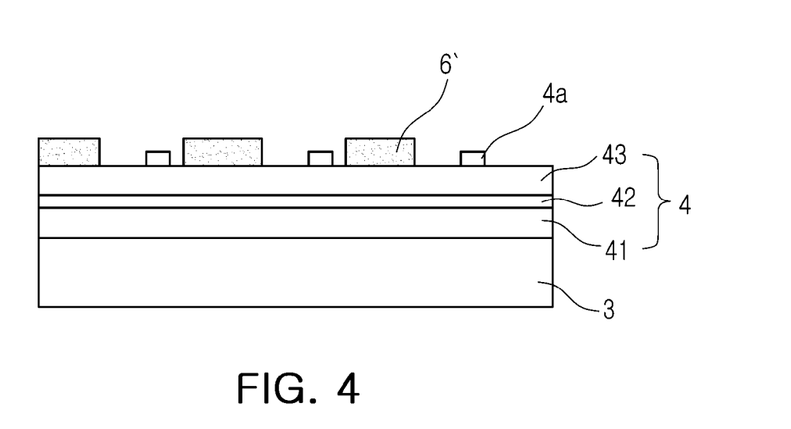

Subsequently, as shown in FIG. 4, the mask 100 may be removed to thus form the light emitting structure 4 having a phosphor layer 6' formed thereon, and according to need, a process for hardening the wavelength conversion material-containing paste 6 may be performed. Further, in detail, though it is not shown, an additional process of separating the above-described manufactured structure into device units may be performed through a mechanical cutting process using a cutting device such as a dicing blade, a dicing process, a scribing process, an etching process, or the like.

On the other hand, in the case of a method of manufacturing a semiconductor light emitting device using the mask 200 or 201 for an application of paste according to the embodiment of the present invention of FIG. 5, the processes illustrated in FIGS. 1 to 4, except for a shape of the mask, may be equally applied thereto. In detail, as shown in FIG. 9, a mask 200 or 201 for an application of paste, which includes a plurality of open parts 210, 211 formed in a device unit region and extended open parts 220, 221 extended from corners provided by adjacent sidewalls in the open parts 210, 211, may be disposed on the light emitting structure 4 shown in FIG. 1. Whereby, paste may be evenly applied up to a region adjacent to apexes of respective light emitting devices and thus, a semiconductor light emitting device capable of securing light uniformity may be manufactured. In addition, as described above, in a case in which the mask including the extended open part 220 or 221 according to the embodiment of the present invention shown in FIG. 9 is used together with the mask 100 or 101 provided according to the embodiment of the present invention shown in FIG. 5, enhanced efficiency in the phosphor application process may be significantly increased.

As set forth above, according to an embodiment of the present invention, the accuracy and the reliability during the wavelength conversion material-containing paste applying process may be enhanced, and efficiency in the wavelength conversion material-containing paste applying process may be increased.

In addition, a mask for an application of paste, allowing for a uniform application of a wavelength conversion material-containing paste to a light emitting device surface may be provided.

While the present invention has been shown and described in connection with the embodiments in the, it will be apparent to those skilled in the art that modifications and variations can be made without departing from the spirit and scope of the invention as defined by the appended claims.

What is claimed is:

1. A method of manufacturing a semiconductor light emitting device, the method comprising:
preparing a light emitting structure including first and second conductive semiconductor layers and an active layer disposed therebetween;
forming at least one electrode on a surface of the light emitting structure;
disposing a mask having a first open part and a recess part on the surface of the light emitting structure, wherein the first open part exposes a portion of the surface of the light emitting structure therethrough, and the recess part corresponds to a region on the surface of the light emitting structure where the at least one electrode is located; and
applying a wavelength conversion material-containing paste to the surface of the light emitting structure through the first open part.

2. The method of claim 1, wherein the electrode is disposed within the recess part of the mask.

3. The method of claim 1, wherein the recess part has a shape corresponding to that of the electrode.

4. The method of claim 1, wherein the electrode is formed in plural on a unit region of a device provided by separating the light emitting structure into unit regions.

5. The method of claim 1, wherein the mask includes a plurality of first open parts, and the unit region of the device on which the separated light emitting structure is formed is exposed through the plurality of first open parts.

6. The method of claim 1, wherein the mask includes an extended open part extending away from the first open part at a corner formed by adjacent sidewalls of an interior of the first open part.

7. The method of claim 1, wherein one surface of the mask is coated with a high hardness material.

8. The method of claim 7, wherein the high hardness material contains at least one of aluminum (Al) or a transition metal nitride, a carbo-nitride, diamond-like carbon (DLC), amorphous carbon, and a cubic boron nitride.

9. The method of claim 1, wherein the applying of the wavelength conversion material-containing paste is performed through a screen printing or spray coating scheme.

10. The method of claim 1, further comprising sequentially stacking the first conductive semiconductor layer, the active layer and the second conductive semiconductor layer on a wafer, to thus form the light emitting structure.

11. The method of claim 1, further comprising forming a conductive substrate on the second conductive semiconductor layer of the light emitting structure.

12. The method of claim 1, further comprising separating the light emitting structure having the wavelength conversion material-containing paste applied thereon, into device units.

13. The method of claim 1, wherein the wavelength conversion material-containing paste contains at least one of a phosphor particle and a quantum dot.

14. A method of manufacturing a semiconductor light emitting device, the method comprising:

preparing a light emitting structure including first and second conductive semiconductor layers and an active layer disposed therebetween;

disposing a mask including a first open part on a surface of the light emitting structure, wherein the first open part exposes at least a portion of the surface of the light emitting structure therethrough and having a sidewall therein, and an extended open part extending away from the first open part at a corner formed by adjacent sidewalls of the first open part; and applying a wavelength conversion material-containing paste to the surface of the light emitting structure through the first open part and the extended open part.

15. The method of claim 14, wherein the first open part has a polyprismatic-shape.

16. The method of claim 14, wherein the extended open part has a cylindrical or polyprismatic shape.

17. The method of claim 14, wherein the mask includes a plurality of first open parts through which a unit area of a device to be provided through a separation process of the light emitting structure is exposed.

18. The method of claim 14, wherein one surface of the mask is coated with a high hardness material.

19. The method of claim 18, wherein the high hardness material contains at least one of Al or a transition metal nitride, a carbo-nitride, diamond-like carbon (DLC), amorphous carbon, and a cubic boron nitride.

20. The method of claim 14, wherein the applying of the wavelength conversion material-containing paste is performed through a screen printing or spray coating scheme.

* * * * *